(12) United States Patent
Choi et al.

(10) Patent No.: US 11,362,021 B2
(45) Date of Patent: Jun. 14, 2022

(54) PRESSURIZING MEMBERS FOR SEMICONDUCTOR PACKAGE

(71) Applicant: JMJ Korea Co., Ltd., Bucheon-si (KR)

(72) Inventors: Yun Hwa Choi, Bucheon-si (KR); Jeonghun Cho, Goyang-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 50 days.

(21) Appl. No.: 17/068,808

(22) Filed: Oct. 12, 2020

(65) Prior Publication Data
US 2021/0280501 A1 Sep. 9, 2021

(30) Foreign Application Priority Data
Mar. 3, 2020 (KR) .................. 10-2020-0026398

(51) Int. Cl.
*H01L 23/495* (2006.01)
*H01L 21/48* (2006.01)

(52) U.S. Cl.
CPC .... *H01L 23/49524* (2013.01); *H01L 21/4821* (2013.01); *H01L 23/49575* (2013.01); *H01L 2221/1073* (2013.01)

(58) Field of Classification Search
CPC ......... H01L 23/49524; H01L 23/49575; H01L 23/585; H01L 23/49811; H01L 21/4821

USPC ........................................................ 257/666
See application file for complete search history.

(56) References Cited

U.S. PATENT DOCUMENTS

| 2011/0049692 A1* | 3/2011 | Tzu ................... H01L 23/49562 257/676 |
| 2016/0204057 A1* | 7/2016 | Yato ........................ H01L 23/24 257/684 |

FOREIGN PATENT DOCUMENTS

| JP | H5-67047 U | 9/1993 |
| JP | 2001-135762 A | 5/2001 |
| JP | 2013-251429 A | 12/2013 |
| JP | 2016-046314 A | 4/2016 |
| KR | 10-0261942 B1 | 7/2000 |
| KR | 10-2013-0115456 A | 10/2013 |
| KR | 10-2016-0109573 A | 9/2016 |
| KR | 10-2008209 B1 | 8/2019 |
| KR | 10-2051639 B1 | 12/2019 |

* cited by examiner

*Primary Examiner* — Quoc D Hoang
(74) *Attorney, Agent, or Firm* — Park, Kim & Suh, LLC

(57) ABSTRACT

Provided is a pressurized semiconductor package including a lead frame including a pad board and a first terminal, a semiconductor chip, pressurizing members stacked to pressurize the semiconductor chip, and a package housing. The semiconductor chip is physically pressurized by the pressurizing members and is electrically connected to improve durability of the semiconductor package and to simplify a manufacturing process.

18 Claims, 12 Drawing Sheets

120 : 110, 121, 122

PRESSURIZING MEMBERS FOR SEMICONDUCTOR PACKAGE

CROSS-REFERENCE TO RELATED PATENT APPLICATION

This application claims the benefit of Korean Patent Application No. 10-2020-0026398, filed on Mar. 3, 2020, in the Korean Intellectual Property Office, the disclosure of which is incorporated herein in its entirety by reference.

BACKGROUND OF THE INVENTION

1. Field of the Invention

The present invention relates to a pressurized semiconductor package and a method of manufacturing the same in which a semiconductor chip is physically pressurized by at least one pressurizing member and is electrically connected to improve durability of the semiconductor package and to simplify a manufacturing process.

2. Description of the Related Art

In general, a semiconductor chip package is formed in such a way that a semiconductor chip is mounted and attached on a board, is electrically connected to a lead frame by using a clip structure or a bonding wire, and is molded by a thermosetting material.

In order to electrically connect a semiconductor chip to a terminal, a conductive adhesive is used as a solder in a general semiconductor package. Here, the conductive adhesive may be hardly applied in operation condition at high temperature due to its melting point. Also, when silver sintering or copper paste is used, manufacturing costs are increased due to its high price.

In addition, when a semiconductor package is completely assembled, a property test is performed. When poor-quality assembly or damage in elements is identified in the property test, it is impossible to individually change the corresponding elements and thereby, the whole semiconductor package falls into disuse so that production yield is lowered.

In regard to this, Korean Patent Registration No. 10-2051639 is disclosed. A pressurized semiconductor power device package illustrated in FIG. 1 includes a first metal board 300, a second metal board 400, a spacer 500, and a diode chip 600, wherein the first metal board 300 is connected to an anode terminal of the diode chip 600 and is used for an anode, the second metal board 400 is connected to a cathode terminal of the diode chip 600 and is used for a cathode, and the spacer 500 and the diode chip 600 are interposed between the first metal board 300 and the second metal board 400. Accordingly, in a diode package 2, pressurizing members 100 are used to structurally and strongly connect the first metal board 300 to the second metal board 400 and thereby, to accurately, stably, and electrically connect each circuit terminal of the diode chip 600 to the first and second terminals 300 and 400 so that a conduction state is maintained.

However, since the pressurizing members pressurize edge areas of an upper metal board and a lower metal board so as to indirectly pressurize a semiconductor chip interposed between the upper and lower metal boards, pressure applied to the semiconductor chip is lowered and thus, durability needs to be improved more.

SUMMARY OF THE INVENTION

The present invention provides a pressurized semiconductor package and a method of manufacturing the same in which a semiconductor chip is physically pressurized by at least one pressurizing member and is electrically connected to improve durability of the semiconductor package and to simplify a manufacturing process.

According to an aspect of the present invention, there is provided a pressurized semiconductor package including: a lead frame comprising at least one pad board and at least one first terminal formed on the pad board; at least one semiconductor chip placed on the lead frame; at least one pressurizing member stacked on the semiconductor chip to pressurize the semiconductor chip so as to electrically connect the first terminals to the semiconductor chips; and a package housing formed on the pad boards to protect the semiconductor chips.

The lead frame may include a conductive adhesive or a non-conductive adhesive to attach the pad boards to the first terminals.

The first terminals may be attached to the pad boards by using connection members.

In the lead frame, the first terminals may be attached to the pad boards by ultrasonic welding or laser welding.

The pressurizing members may apply pressure to the semiconductor chips so as to electrically connect the first terminals to the semiconductor chips without using a separate adhesive and to allow the semiconductor chips to normally operate, and the pressurizing members may remove pressure applied to the semiconductor chips so as to release electrical connection between the first terminals and the semiconductor chips and to allow the semiconductor chips not to normally operate.

The pressurizing members may include a first pressurizing member disposed on the semiconductor chips to pressurize the semiconductor chips, and at least one additional pressurizing member additionally pressurizing the first pressurizing member to electrically connect the semiconductor chips.

The semiconductor chips may be placed on one end of the first terminals or the pad boards of the lead frame.

The semiconductor chips may be attached to the lead frame by using a conductive adhesive or a non-conductive adhesive or by pressure applied from the pressurizing members without using a separate adhesive.

The first terminals may be bent in a vertical direction from the pad area, and the pressurizing members may include a first pressurizing member including a pressurizing unit which elastically pressurizes the upper part of the semiconductor chip, and a second terminal which is connected to the pressurizing unit, fixed on the pad board, and bent in a vertical direction.

The pressurizing members may further include a second pressurizing member stacked on the upper part of the pressurizing unit of the first pressurizing member, fixed on the pad board, and additionally pressurizing in a direction crossing the pressurizing unit.

The pressurizing members may further include a third pressurizing member which penetrates the second pressurizing member and additionally pressurizes the pressurizing unit of the first pressurizing member toward the semiconductor chip.

The first terminals may be bent in a vertical direction from the pad board and may be bent in an inner direction or an outer direction of the package housing to finally form the pressurized semiconductor package.

According to another aspect of the present invention, there is provided a method of manufacturing a pressurized semiconductor package including: preparing a lead frame comprising at least one pad board and at least one first terminal formed on the pad board; placing at least one semiconductor chip on the lead frame; stacking at least one pressurizing member on the semiconductor chip to pressurize the semiconductor chip so as to electrically connect the first terminals to the semiconductor chips; and forming a package housing formed on the pad boards to protect the semiconductor chips.

The pressurizing members may apply pressure to the semiconductor chips so as to electrically connect the first terminals to the semiconductor chips without using a separate adhesive and to allow the semiconductor chips to normally operate, and the pressurizing members may remove pressure applied to the semiconductor chips so as to release electrical connection between the first terminals and the semiconductor chips and to allow the semiconductor chips not to normally operate.

The pressurizing members may include a first pressurizing member disposed on the semiconductor chips to pressurize the semiconductor chips, and at least one additional pressurizing member additionally pressurizing the first pressurizing member to electrically connect the semiconductor chips.

The semiconductor chips may be attached to the lead frame by using pressure applied from the pressurizing members without using a separate adhesive.

The first terminals may be bent in a vertical direction from the pad area, and the pressurizing members may include a first pressurizing member including a pressurizing unit which elastically pressurizes the upper part of the semiconductor chip, and a second terminal which is connected to the pressurizing unit, fixed on the pad board, and bent in a vertical direction.

The pressurizing members may further include a second pressurizing member stacked on the upper part of the pressurizing unit of the first pressurizing member, fixed on the pad board, and additionally pressurizing in a direction crossing the pressurizing unit.

The pressurizing members may further include a third pressurizing member which penetrates the second pressurizing member and additionally pressurizes the pressurizing unit of the first pressurizing member toward the semiconductor chip.

The first terminals may be bent in a vertical direction from the pad board and may be bent in an inner direction or an outer direction of the package housing to finally form the pressurized semiconductor package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

Figure 1:
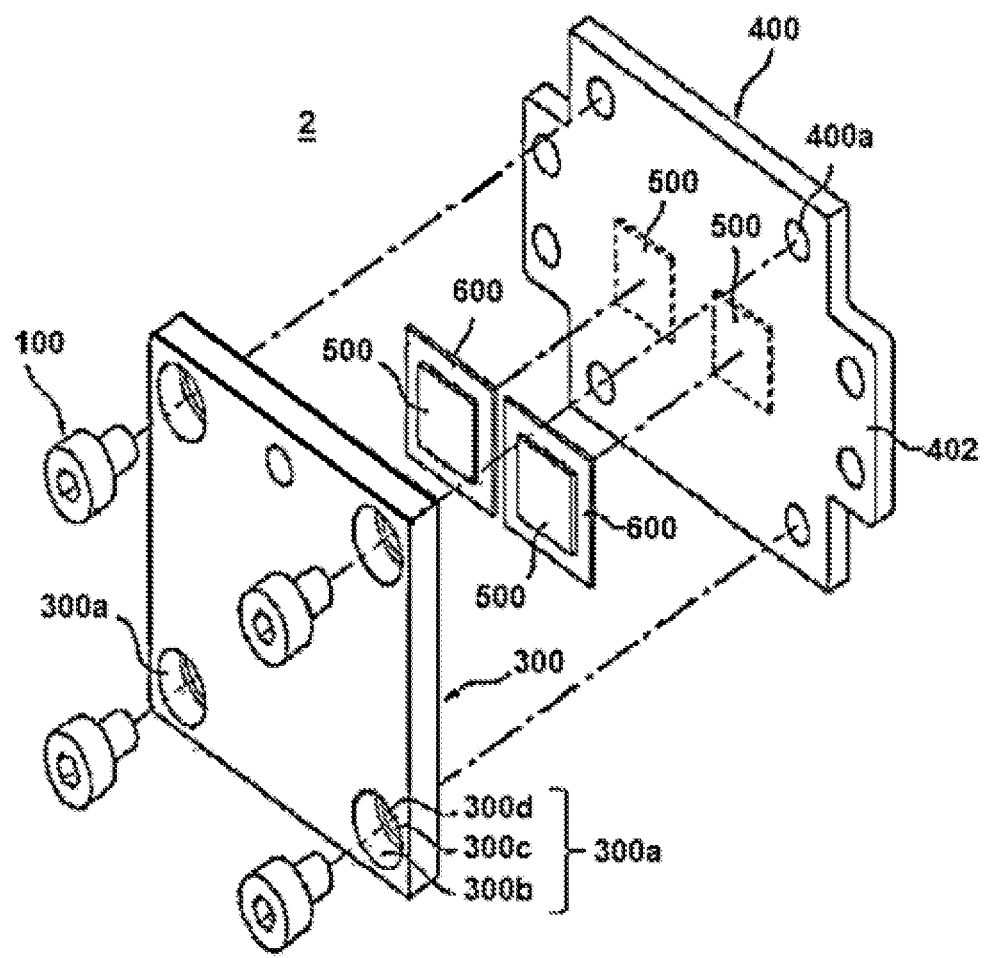
FIG. 1 illustrates a conventional pressurized semiconductor power device package.
Figure 2A:
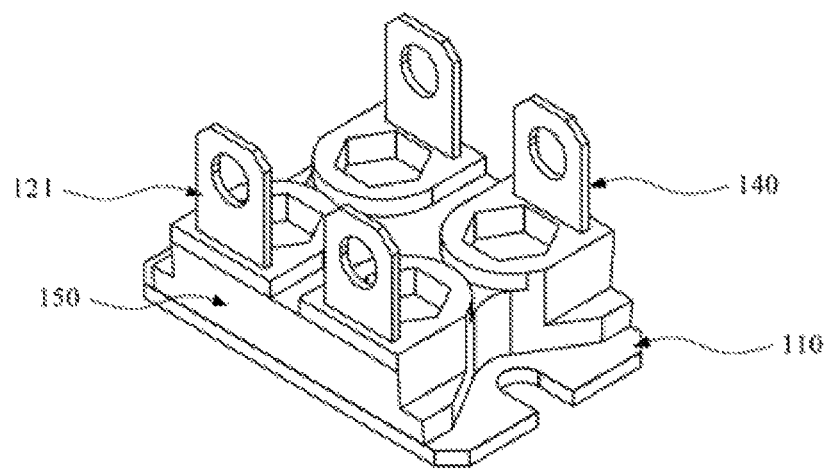
FIGS. 2A and 2B are perspective views of a single pressurized semiconductor package according to an embodiment of the present invention.
Figure 2B:
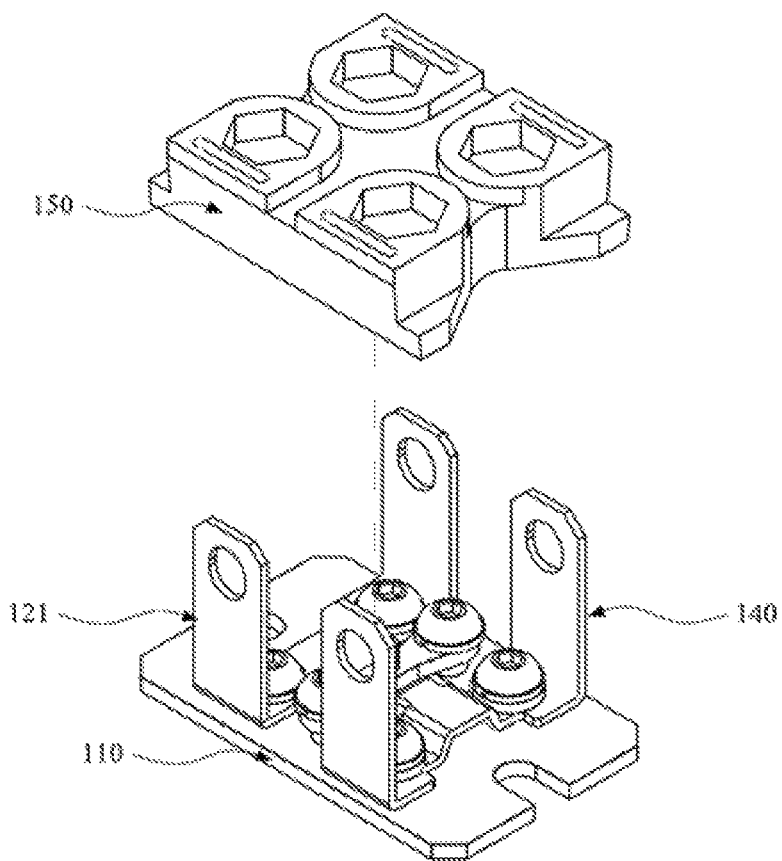
Figure 6A:
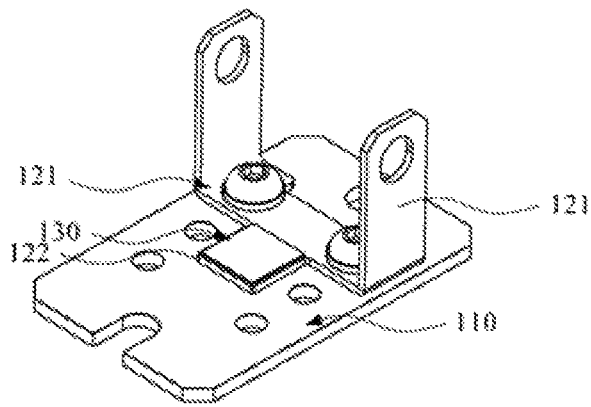
FIGS. 6A to 6C illustrate examples showing that a semiconductor chip is attached to the single pressurized semiconductor package of FIGS. 2A and 2B.
Figure 6B:
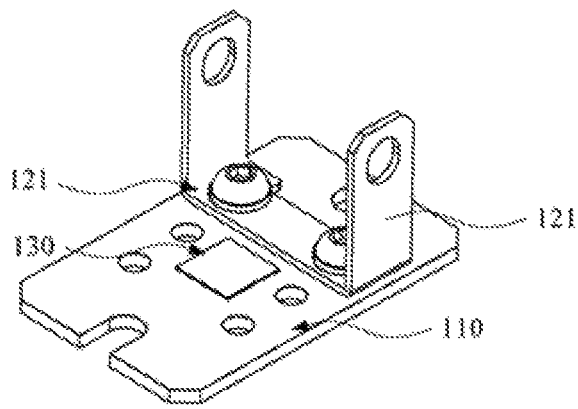
Figure 6C:
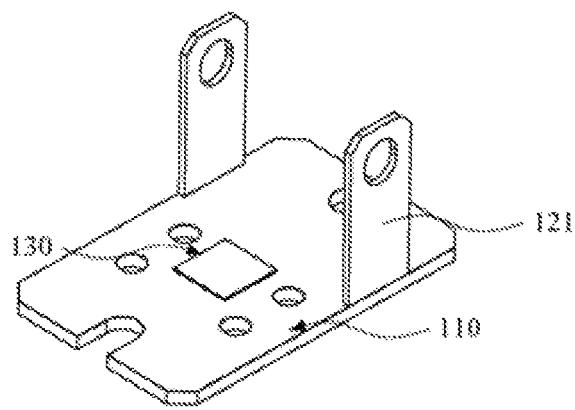
Figure 7A:
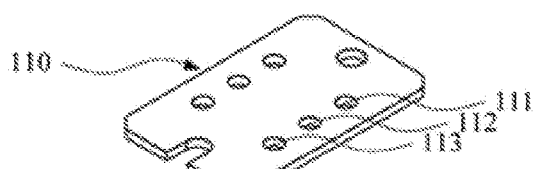
FIGS. 7A to 7G is a flowchart illustrating a method of manufacturing the single pressurized semiconductor package of FIGS. 2A and 2B according to an embodiment of the present invention.
Figure 7B:
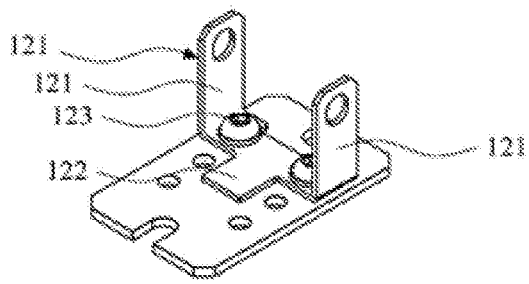
Figure 7C:
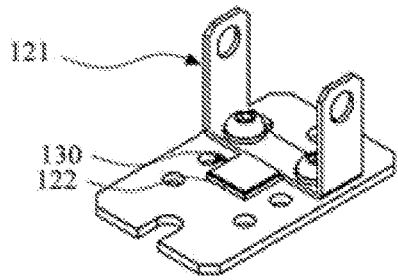
Figure 7D:
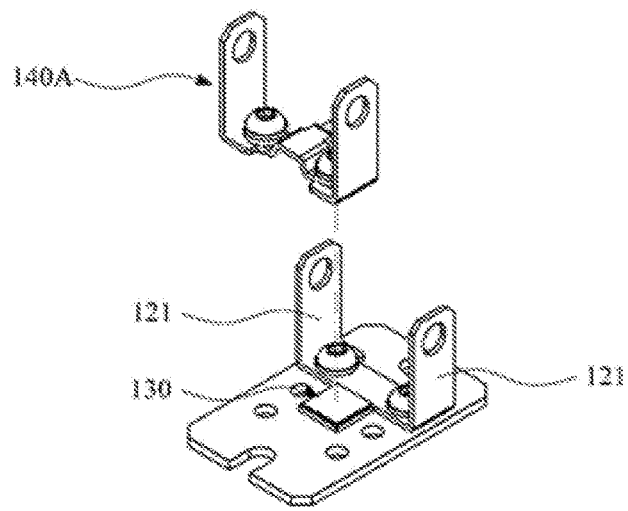
Figure 7E:
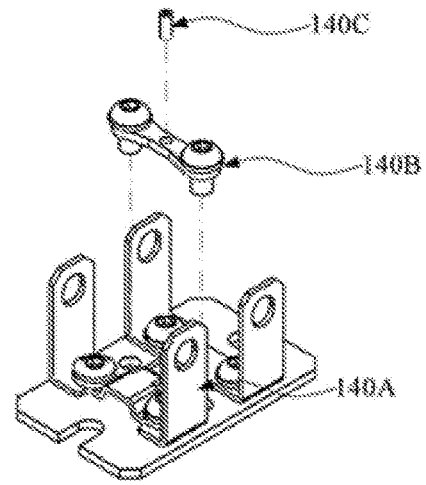
Figure 7F:
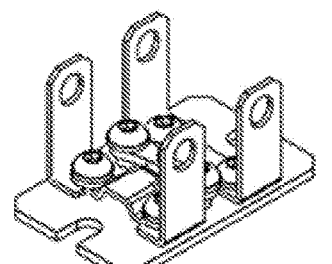
Figure 7G:
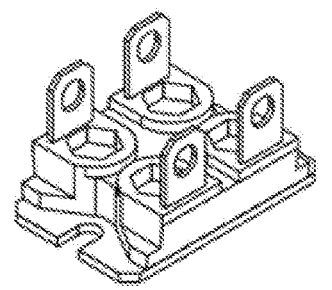
Figure 8A:
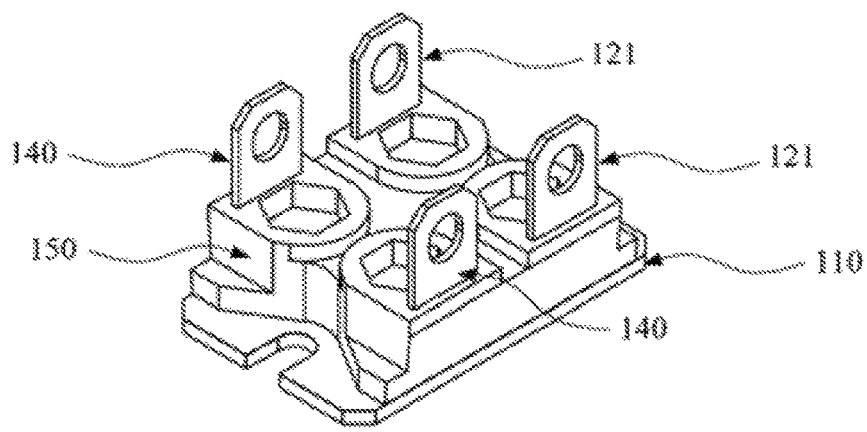
FIGS. 8A and 8B are perspective views of a dual pressurized semiconductor package according to an embodiment of the present invention.
Figure 8B:
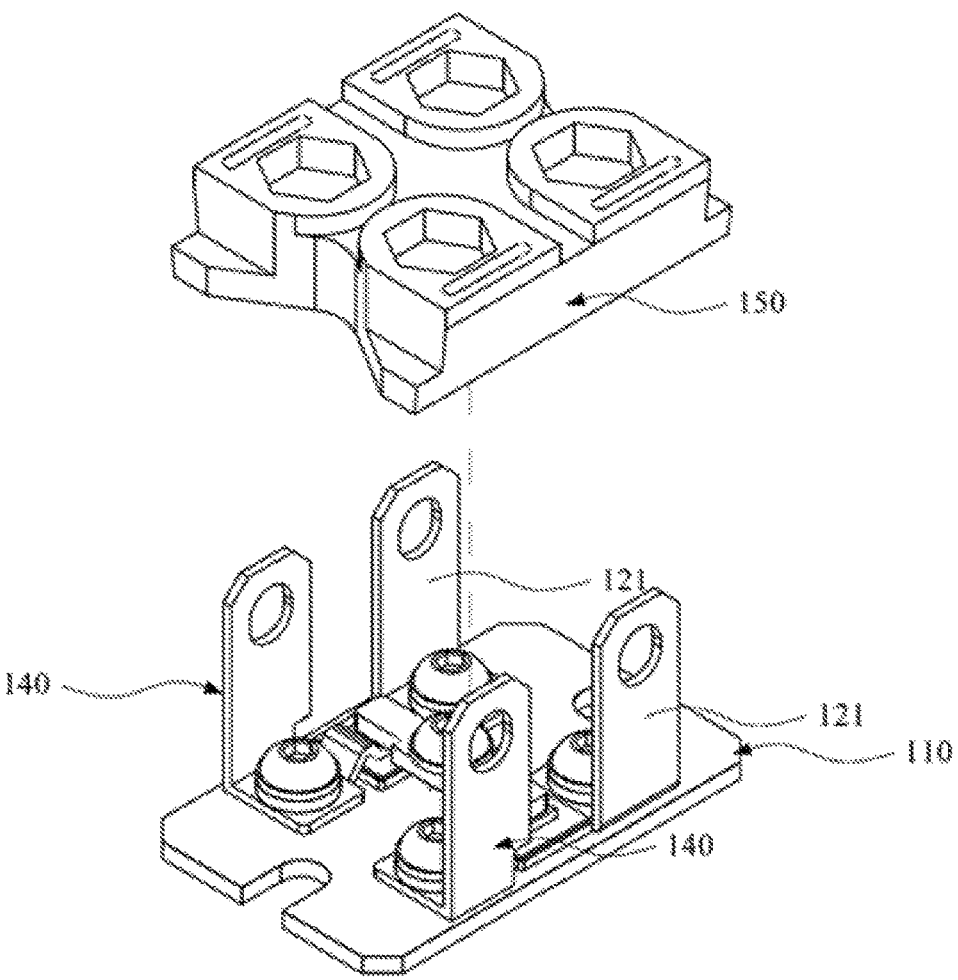
Figure 9:
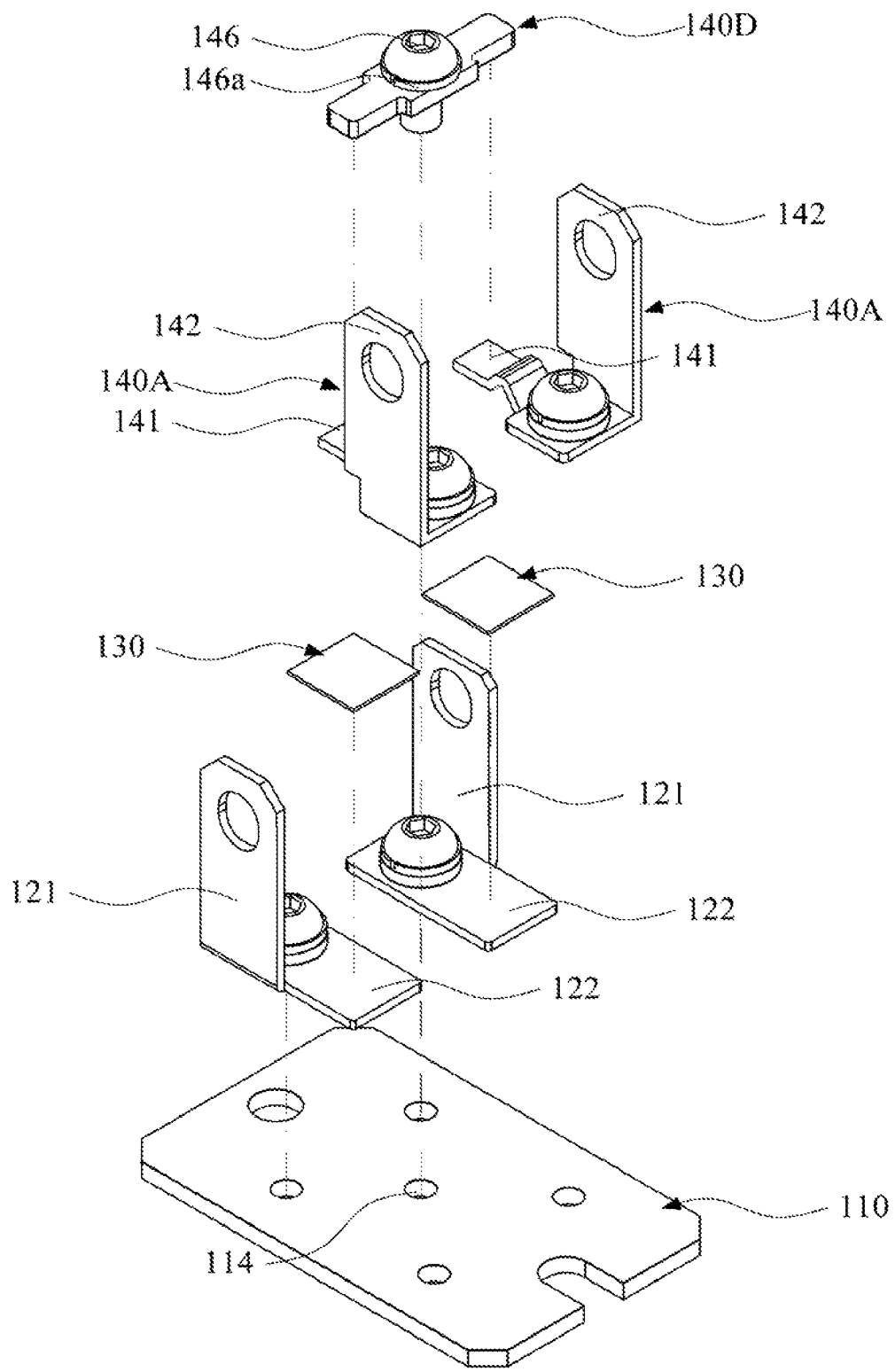
FIG. 9 is an exploded perspective view of the dual pressurized semiconductor package of FIGS. 8A and 8B.
Figure 10A:
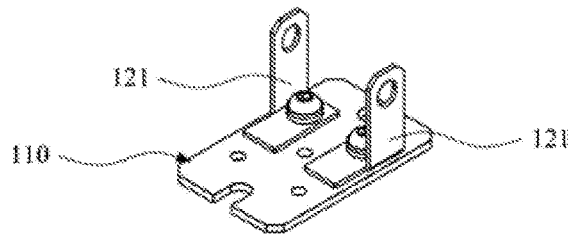
FIGS. 10A to 10F is a flowchart illustrating a method of manufacturing the dual pressurized semiconductor package of FIGS. 8A and 8B.
Figure 10B:
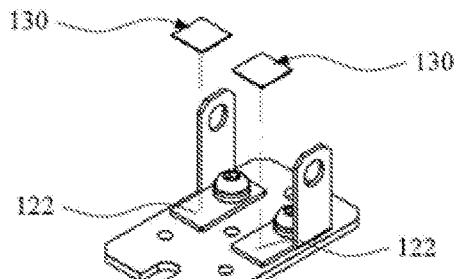
Figure 10C:
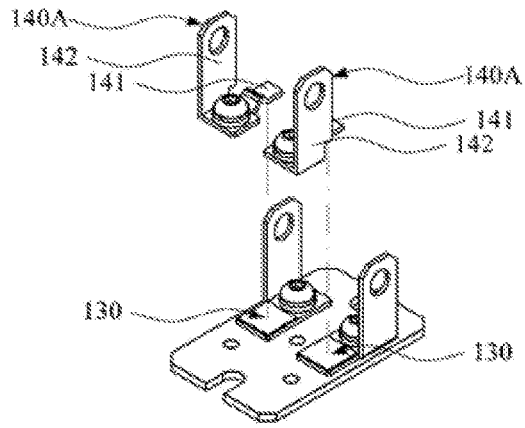
Figure 10D:
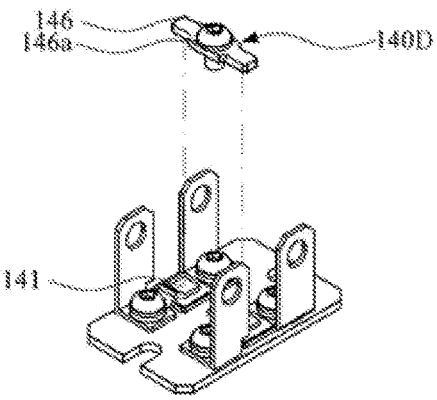
Figure 10E:
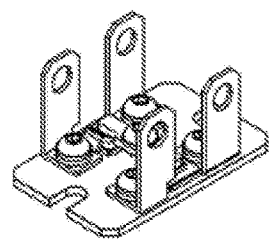
Figure 10F:
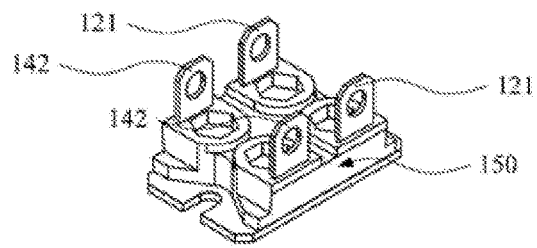
Figure 11A:
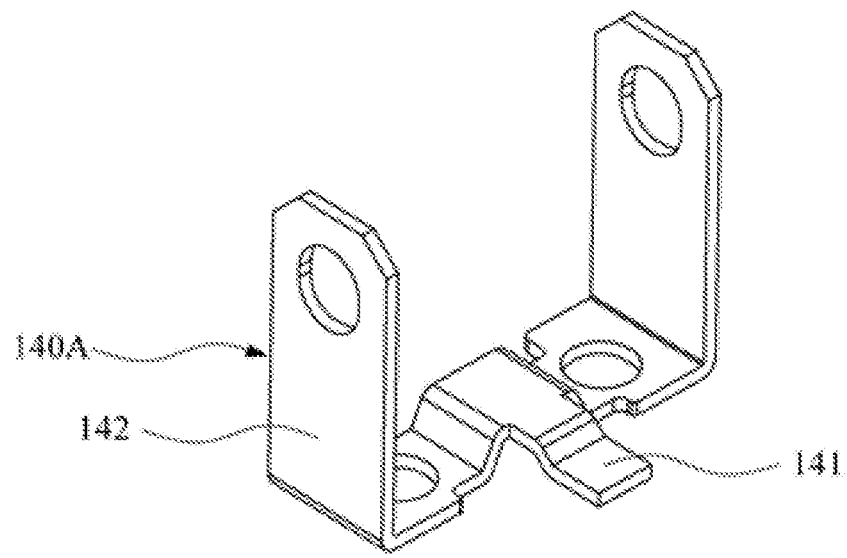
FIGS. 11A and 11B are exploded views respectively illustrating a first pressurizing member of the single pressurized semiconductor package of FIGS. 2A and 2B, and the dual pressurized semiconductor package of FIGS. 8A and 8B.
Figure 11B:
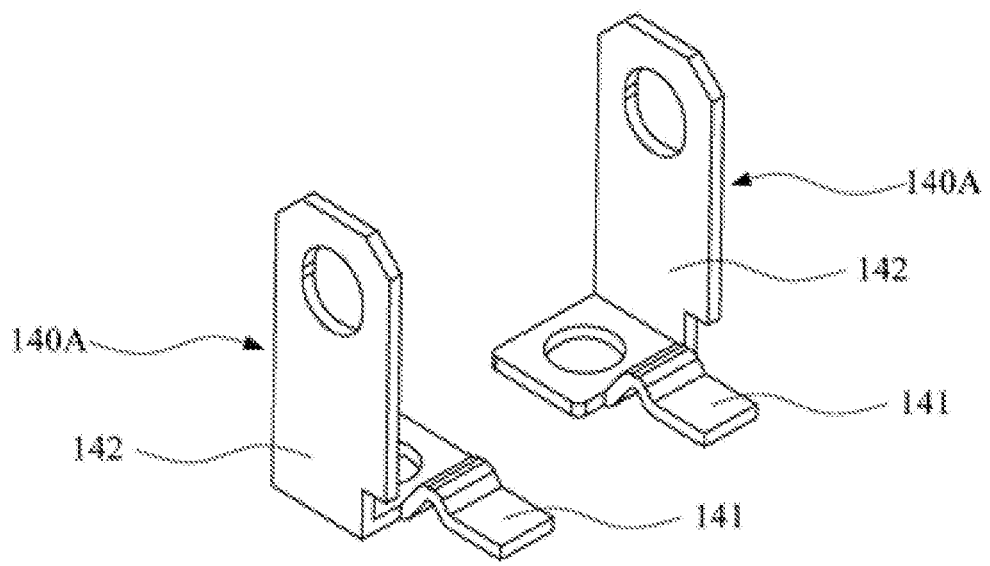

FIGS. 2A through 6C illustrate a single pressurized semiconductor package according to an embodiment of the present invention, FIGS. 8A to 9 illustrate a dual pressurized semiconductor package according to another embodiment of the present invention, FIGS. 7A to 7G are flowcharts illustrating a method of manufacturing the single pressurized semiconductor package of FIGS. 2A and 2B according to an embodiment of the present invention, FIGS. 10A to 10F are flowcharts illustrating a method of manufacturing the dual pressurized semiconductor package of FIGS. 8A and 8B according to another embodiment of the present invention, and FIGS. 11A and 11B are exploded views respectively illustrating an elastic pressurization structure of a first pressurizing member 140A of the single pressurized semiconductor package of FIGS. 2A and 2B, and the dual pressurized semiconductor package of FIGS. 8A and 8B.

Referring to FIGS. 2A through 6C, a single pressurized semiconductor package according to an embodiment of the present invention includes a lead frame 120 including a pad board 110 and a first terminal 121, a semiconductor chip 130, pressurizing members 140 stacked to pressurize the semiconductor chip 130, and a package housing 150 formed to cover the semiconductor chip 130. The semiconductor chip 130 is physically pressurized by the pressurizing members 140 and is electrically connected to improve durability of the semiconductor package and to simplify a manufacturing process.

Firstly, in order to form the lead frame 120, at least one pad board 110 includes a space where first terminals 121, the semiconductor chip 130, or the pressurizing members 140 are attached.

For example, as illustrated in FIG. 6A, the first terminals 121 is directly attached on the pad board 110 and the semiconductor chip 130 is placed on a pad area 122 disposed at one end of the first terminal 121. Also, as illustrated in FIG. 6B, the semiconductor chip 130 is spaced apart from the first terminals 121 by a predetermined interval and is placed on the pad board 110. Then, the semiconductor chip 130 is electrically connected to the first terminals 121 through a metal pattern (not illustrated) formed on the pad board 110. In addition, as illustrated in FIG. 6C, the semiconductor chip 130 is placed on the lead frame 120 where the pad board 110 is connected to the first terminals 121 as one body. Therefore, attachment and electrical connection in the pad board 110, the semiconductor chip 13, and the first terminals 121 may vary.

Next, the lead frame 120 may include at least one first terminal 121 on the pad board 110.

For example, at least one first terminal 121 may include the pad area 122 at one end thereof where the semiconductor chip 130 is placed and is electrically connected to the first terminal 121. However, the present invention is not limited thereto and as described above, the semiconductor chip 130 may be spaced apart from the first terminals 121 by a predetermined interval and placed on the pad board 110 (refer to FIG. 6B). Also, the pad board 110 and the first terminals 121 are connected to each other as one body (refer to FIG. 6C).

Also, the first terminals 121 are bent in a vertical direction from the pad area 122, on which the semiconductor chip 130 is placed, or the pad board 110, and end parts (the other ends) of the first terminals 121 may stand upright.

Figure 4:
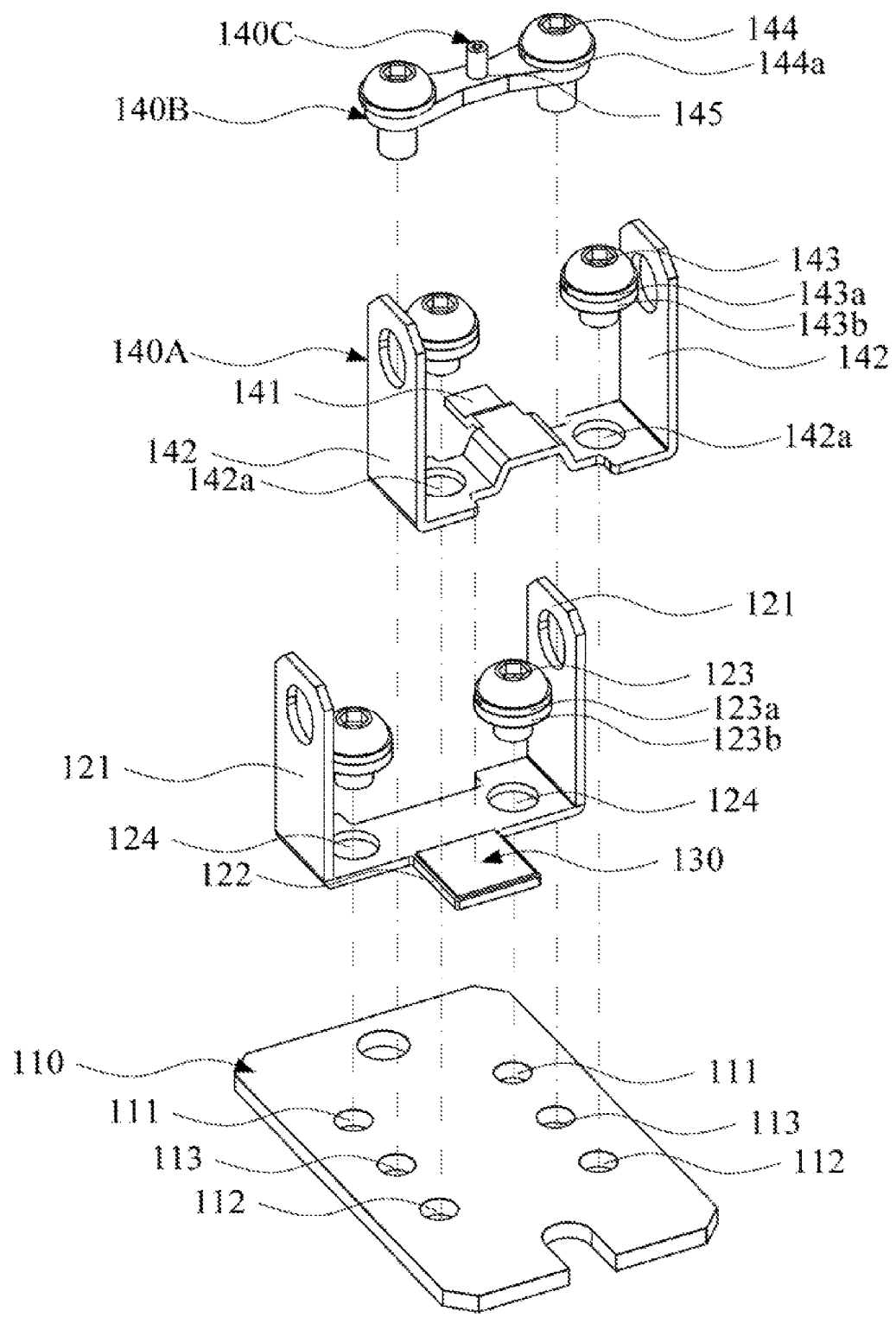
FIG. 4 is an exploded perspective view of the single pressurized semiconductor package of FIGS. 2A and 2B.
Figure 5:
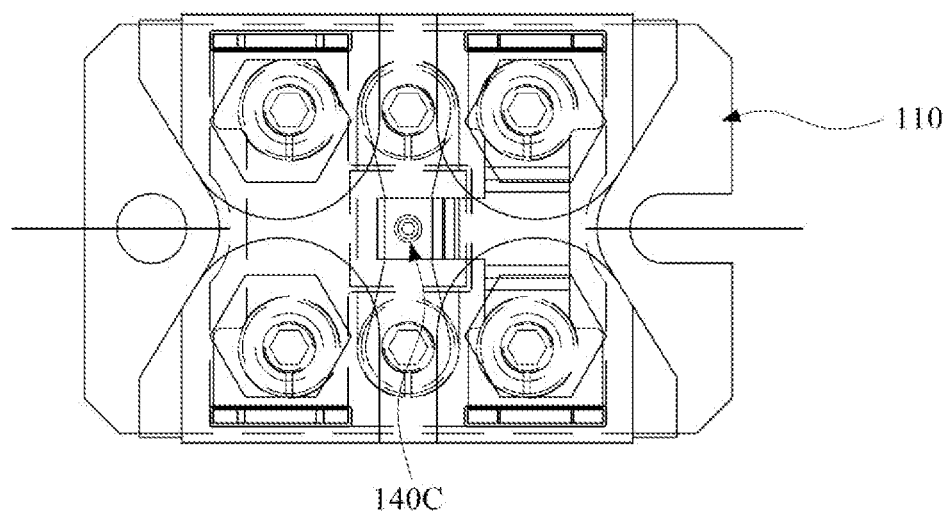
FIG. 5 is a cross-sectional view of the single pressurized semiconductor package of FIGS. 2A and 2B.
Figure 5:
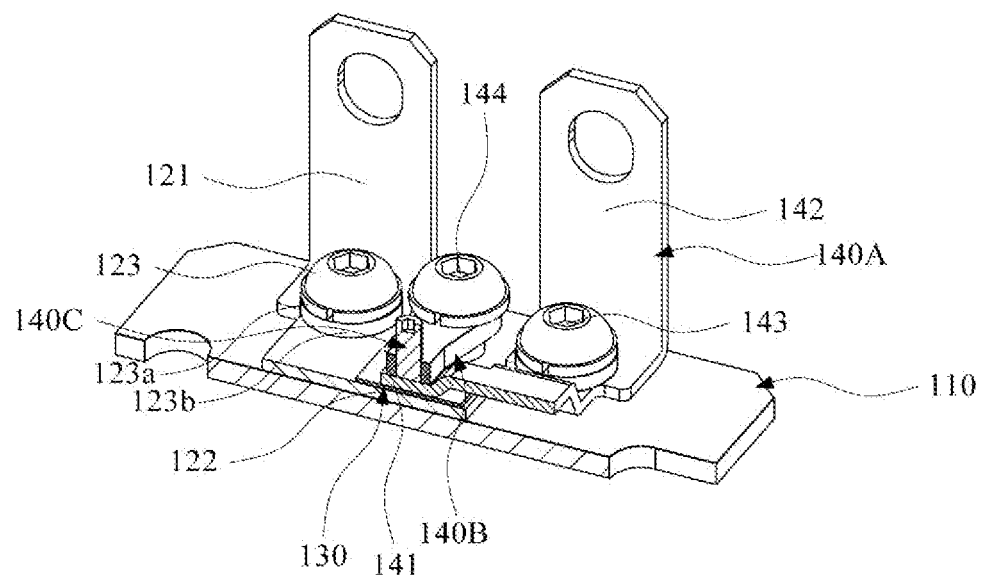

The first terminals 121 may be attached on the pad board 110 using various ways. For example, the lead frame 120 may include a conductive adhesive or a non-conductive adhesive on the pad board 110 to attach the first terminals 121 or the first terminals 121 may be attached on the pad board 110 by ultrasonic welding or laser welding. Also, as illustrated in FIGS. 4 and 5, the first terminals 121 may be attached on the pad board 110 by using connection members. For example, a penetration hole 124 of the first terminal 121 passes through a bolt connection hole 111 of the pad board 110 and a bolt 123 including a washer ring 123a and an insulating ring 123b formed of a ceramic material is joined to the hole so that the first terminals 121 may be fixed to the pad board 110.

Next, at least one semiconductor chip 130 may be included to be placed on the pad area 122 disposed at one end of the first terminals 121, may be directly placed on the pad board 110 as described above, or may be placed on the lead frame 120 where the pad board 110 is connected to the first terminals 121 as one body (refer to FIGS. 6B and 6C).

The semiconductor chip 130 may be attached to the lead frame 120 by pressure applied from the pressurizing members 140, which will be described later, instead of using a separate adhesive. However, the present invention is not limited thereto and when necessary, the semiconductor chip 130 may be attached on the lead frame 120 by using a conductive adhesive or a non-conductive adhesive.

Also, the semiconductor chip 130 may include a diode, IGBT, MOSFET, SiC semiconductor, or GaN semiconductor.

Next, at least one pressurizing member 140 is included to be stacked on the semiconductor chip 130 and structurally pressurizes the semiconductor chip 130 so as to be fixed to the lead frame 120, more specifically, to the pad area 122 disposed at one end of the first terminals 121.

That is, as illustrated in FIGS. 4 and 5, the pressurizing members 140 pressurize the semiconductor chip 130 toward the pad area 122 so that the semiconductor chip 130 is attached and fixed to the pad area 122 and the first terminals 121 and the semiconductor chip 130 are electrically connected to each other.

For example, pressure may be applied to the semiconductor chip 130 by the pressurizing members 140 and thus, the first terminals 121 and the semiconductor chip 130 may be electrically connected to each other so as to operate normally. Also, pressure applied from the pressurizing members 140 may be removed to release electrical connection between the first terminals 121 and the semiconductor chip 130 and thus, normal operation may not be available. Accordingly, when assembly errors or mistakes are identified from a property test performed after assembling the semiconductor package or when the semiconductor chip 130 is damaged, the pressurizing members 140 may be disassembled from the semiconductor chip 130. Then, errors or mistakes may be corrected or the semiconductor chip 130 may be replaced and then, re-assembling may be easily performed.

Figure 12:
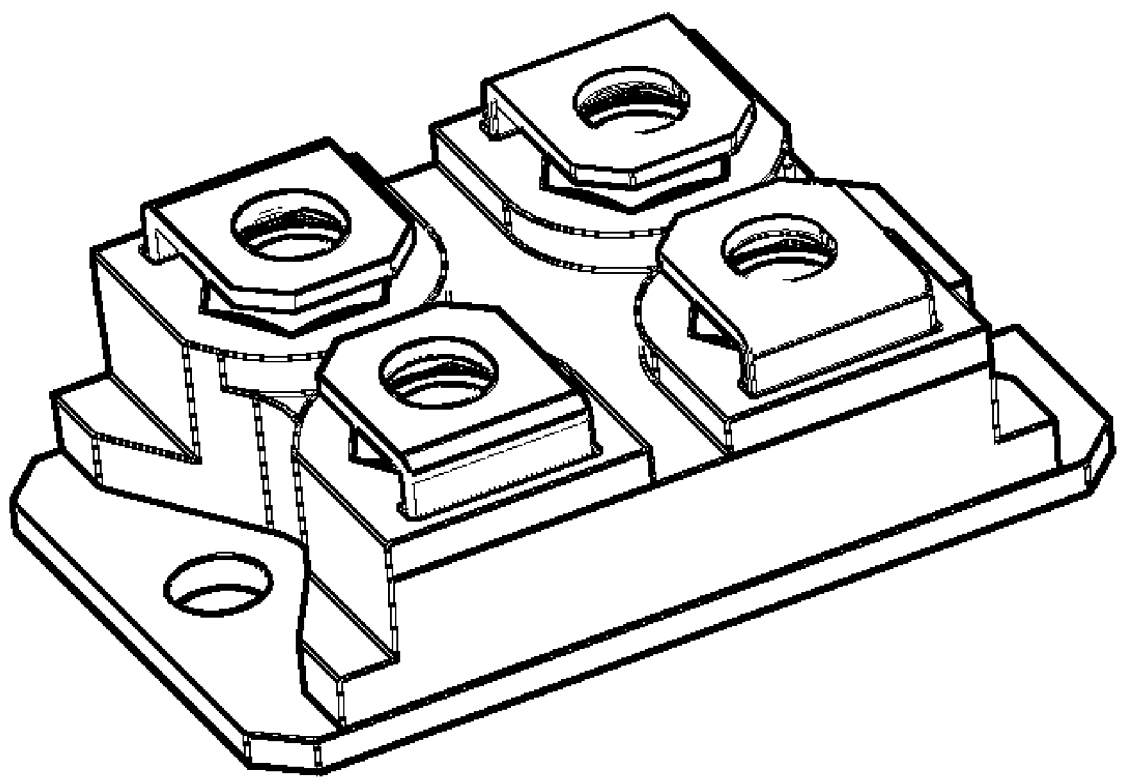
FIG. 12 is a picture of a pressurized semiconductor package according to an embodiment of the present invention.

As illustrated in FIGS. 2A, 5 and 12, upper parts of the at least one pressurizing member 140 are partially exposed to the outside of the package housing 150 and thus, an electric signal may be applied from the outside. Also, the exposed upper parts of the pressurizing members 140 are bent in an inner direction or an outer direction of the package housing 150 and the pressurized semiconductor package may be finally manufactured. Such a way may be applied to the first terminals 121 as in the same manner above.

Figure 3:
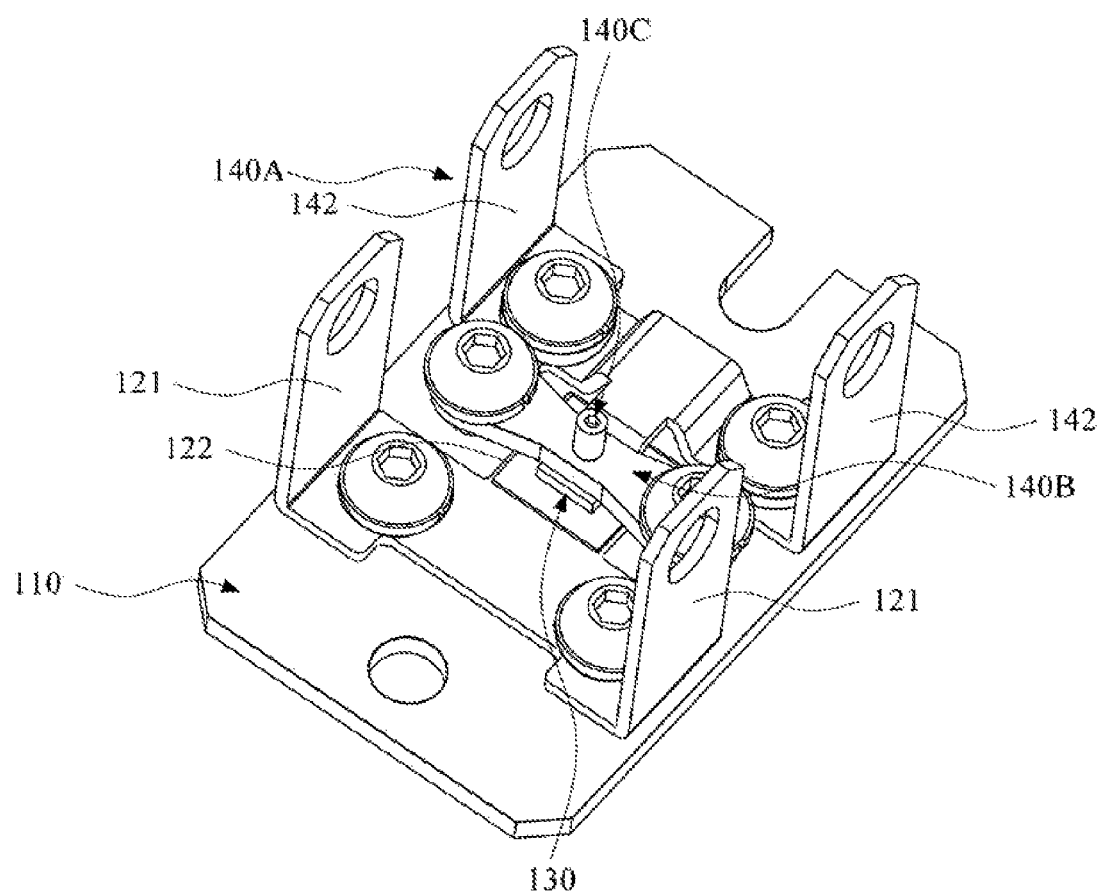
FIG. 3 illustrates an inner structure of the single pressurized semiconductor package of FIGS. 2A and 2B.

More specifically, as illustrated in FIGS. 3 through 5, the pressurizing member 140 includes the first pressurizing member 140A including a pressurizing unit 141 and a second terminal 142, wherein the pressurizing unit 141 elastically pressurizes the upper part of the semiconductor chip 130 and the second terminal 142 is connected to the pressurizing unit 141, fixed on the pad board 110 using a bolt, and includes an end part bent in a vertical direction. Accordingly, the semiconductor chip 130 is firstly and physically pressurized by the first pressurizing member 140A so as to be fixed and electrically connected.

For example, referring to FIG. 4, a penetration hole 142a of the second terminal 142 passes through a bolt connection hole 112 of the pad board 110 and a bolt 143 including a washer ring 143a and an insulating ring 143b formed of a ceramic material is joined to the hole so that the first pressurizing member 140A may be fixed to the pad board 110.

Also, in addition to the first pressurizing member 140A, the pressurizing member 140 further includes a second pressurizing member 140B which is stacked on the upper part of the pressurizing unit 141 of the first pressurizing member 140A, is fixed on the pad board 110 by a connection member, and additionally pressurizes in a direction crossing the pressurizing unit 141. Then, the second pressurizing member 140B may pressurize the pressurizing unit 141 of the first pressurizing member 140A and thereby, the semiconductor chip 130 may be secondarily and physically pressurized and fixed.

For example, referring to FIG. 4, the second pressurizing member 140B may be formed and fixed by connecting a bolt 144 including a washer ring 144a to a bolt connection hole 113.

Also, in addition to the first pressurizing member 140A and the second pressurizing member 140B, the pressurizing member 140 further includes a third pressurizing member 140C which penetrates the second pressurizing member 140B and additionally pressurizes the upper part of the pressurizing unit 141 of the first pressurizing member 140A toward the semiconductor chip 130. Then, the third pressurizing member 140C may pressurize the pressurizing unit 141 of the first pressurizing member 140A and thereby, the semiconductor chip 130 may be thirdly and physically pressurized and fixed.

For example, referring to FIG. 4, the third pressurizing member 140C is inserted into a penetration hole 145 formed at the center of the second pressurizing member 140B and pressurizes the pressurizing unit 141 of the first pressurizing member 140A. Here, the third pressurizing member 140C may be a pogo pin including a spring for elastically pressurizing the pressurizing unit 141, a bolt rotating into the penetration hole 145 and pressurizing the pressurizing unit 141, or a pressurizing member for pressurizing by pushing the pressurizing unit 141.

In addition, the upper part of the third pressurizing member 140C is partially exposed to the outside of the package housing 150 so that the third pressurizing member 140C exposed to the outside of the package housing 150 may be pressurized and thereby, the semiconductor chip 130 may be pressurized so as to be fixed.

In other words, the pressurizing member 140 may include the first pressurizing member 140A directly disposed on the semiconductor chip 130 and at least one additional pressurizing members 140B and 140C additionally pressurizing the first pressurizing member 140A and electrically connecting to the semiconductor chip 130 so as to pressurize the semiconductor chip 130.

Accordingly, the first pressurizing member 140, the second pressurizing member 140B, and the third pressurizing member 140C are sequentially stacked on the upper part of the semiconductor chip 130 so as to pressurize the semiconductor chip 130 and to be strongly fixed to the lead frame 120. Since the semiconductor chip 130 may be attached and fixed by pressure applied from the pressurizing members without using a separate adhesive, the semiconductor chip 130 may be operated in a high-temperature environment regardless of a melting point of an adhesive and thereby, durability may be improved.

Next, the package housing 150 is an insulator for protecting a semiconductor circuit and may be formed of an Epoxy Molding Compound (EMC), PolyPhenylene Sulfide (PPS), or PolyButylene Terephtalate (PBT) for protecting the semiconductor chip 130 while the upper part of the first terminal 121, the upper part of the second terminal 142, or the upper part of the third pressurizing member 140C is partially exposed. For example, the package housing 150 may be formed by using a transfer molding method.

Referring to FIGS. 7A to 7G, a method of manufacturing the single pressurized semiconductor package according to an embodiment of the present invention is described in more detail below.

Firstly, as illustrated in FIG. 7A, at least one pad board 110 including a plurality of bolt connection holes 111, 112, and 113 is prepared and as illustrated in FIG. 7B, the lead frame 120 is prepared by connecting at least one first terminal 121 on the pad board 110 using a bolt.

Then, as illustrated in FIG. 7C, at least one semiconductor chip 130 is placed on the pad area 122 of the lead frame 120.

Here, the first terminals 121 may be attached on the pad board 110 using various methods. For example, the lead frame 120 may include a conductive adhesive or a non-conductive adhesive on the pad board 110 to attach the first terminals 121 or the first terminals 121 may be attached on the pad board 110 by ultrasonic welding or laser welding. Also, as illustrated in FIGS. 4 and 5, the first terminals 121 may be attached on the pad board 110 by using connection members. For example, the penetration hole 124 of the first terminal 121 passes through the bolt connection hole 111 of the pad board 110 and the bolt 123 including the washer ring 123a and the insulating ring 123b formed of a ceramic material is joined to the hole so that the first terminals 121 may be fixed to the pad board 110.

As illustrated in FIG. 6A, the first terminals 121 is directly attached on the pad board 110 and the semiconductor chip 130 is placed on the pad area 122 disposed at one end of the first terminal 121. Also, as illustrated in FIG. 6B, the semiconductor chip 130 is spaced apart from the first terminals 121 by a predetermined interval and is placed on the pad board 110. Then, the semiconductor chip 130 is electrically connected to the first terminals 121 through a metal pattern (not illustrated) formed on the pad board 110. In addition, as illustrated in FIG. 6C, the semiconductor chip 130 is placed on the lead frame 120 where the pad board 110 is connected to the first terminals 121 as one body. Accordingly, attachment and electrical connection in the pad board 110, the semiconductor chip 13, and the first terminals 121 may vary.

Next, as illustrated in FIGS. 7D and 7E, in order to electrically connect the first terminals 121 to the semiconductor chip 130, at least one pressurizing members 140A, 140B, and 140C including at least one second terminals 142 is stacked on the semiconductor chip 130 and thus, the semiconductor chip 130 is pressurized to be strongly fixed between the pad board 110 and the lead frame 120.

Finally, as illustrated in FIGS. 7F and 7G, the package housing 150 protecting the semiconductor chip 130 is formed on the pad board 110 to partially expose the other end of the first terminals 121 and/or the end part of the second terminals 142.

The single pressurized semiconductor package according to an embodiment of the present invention and the method of manufacturing the same are described above with reference to FIGS. 2A through 7G. Then, a dual pressurized semiconductor package according to another embodiment of the present invention and a method of manufacturing the same will be described below with reference to FIGS. 8A through 10F. Here, only differences between the single pressurized semiconductor package and the dual pressurized semiconductor package will be briefly described.

Firstly, in order to form the lead frame 120, at least one pad board 110 includes a space where first terminals 121, the semiconductor chip 130, or the pressurizing members 140 are attached.

Next, as illustrated in FIGS. 9 and 10A, at least one first terminals 121 is formed on the pad board 110 and is physically separated into a pair facing each other. Then, the pair of first terminals 121 is each connected to the pad board 110 using a bolt.

Here, the other ends of the first terminals 121 may be bent in a vertical direction from the pad area 122 at one end of the first terminal 121, on which the semiconductor chip 130 is placed, and end parts of the first terminals 121 may stand upright.

Next, as illustrated in FIGS. 9 and 10B, at least one semiconductor chip 130 may be placed on each of the pad area 122 and the semiconductor chip 130 may include a diode, IGBT, MOSFET, SiC semiconductor, or GaN semiconductor.

Then, as illustrated in FIGS. 9 and 10C, at least one pressurizing member 140 is included to be each stacked on the plurality of semiconductor chip 130 and structurally pressurizes the semiconductor chip 130 so as to be fixed to the pad area 122.

More specifically, the plurality of pressurizing members 140 is separated into a pair facing each other and includes the first pressurizing member 140A including the pressurizing unit 141 and the second terminal 142, wherein the pressurizing unit 141 elastically pressurizes the upper part of the semiconductor chip 130 and the second terminal 142 is connected to the pressurizing unit 141, fixed on the pad board 110 using a bolt, and includes an end part bent in a vertical direction. Accordingly, the semiconductor chip 130 is firstly and physically pressurized by the first pressurizing member 140A so as to be fixed and electrically connected.

Also, as illustrated in FIGS. 9 and 10D, in addition to the first pressurizing member 140A, the pressurizing member 140 further includes a second pressurizing member 140D which is stacked on the upper part of the pressurizing unit 141 of the first pressurizing member 140A, is fixed on the pad board 110 by a connection member, and additionally pressurizes in a direction crossing the pressurizing unit 141. Accordingly, the second pressurizing member 140D may pressurize the pressurizing units 141 at both ends of the first pressurizing member 140A and thereby, the semiconductor chip 130 may be secondarily and physically pressurized and fixed.

For example, referring to FIG. 9, the second pressurizing member 140D is fixed to the pad board 110 by connecting a bolt 146 including a washer ring 146a to a bolt connection hole 114 of the pad board 110. Then, the both ends of the second pressurizing member 140D may pressurize each of the pressurizing units 141 of the first pressurizing members 140A.

Accordingly, the first pressurizing member 140A and the second pressurizing member 140D are sequentially stacked on the upper part of the semiconductor chip 130 so as to pressurize the semiconductor chip 130 and to be strongly fixed to the lead frame 120. Since the semiconductor chip 130 may be attached and fixed by pressure applied from the pressurizing members without using a separate adhesive, the semiconductor chip 130 may be operated in a high-temperature environment regardless of a melting point of an adhesive and thereby, durability may be improved.

Next, as illustrated in FIGS. 9, 10E, and 10F, the package housing 150 may be formed of an EMC, PBT, or PPS for protecting the semiconductor chip 130 while the other ends of the first terminals 121 and/or the end parts of the second terminals 142 are partially exposed on the pad board 110.

FIG. 11A illustrates the first pressurizing member 140A of the single pressurized semiconductor package, wherein the pressurizing unit 141 is bent to form a stepped part from a horizontal board of the second terminal 142 and elastically pressurizes the semiconductor chip 130. FIG. 11B illustrates the first pressurizing member 140A of the dual pressurized semiconductor package. Here, each of the pressurizing units 141 includes a stretchable folded part extended from a horizontal board of the second terminal 142 and pressurizes the semiconductor chip 130. Accordingly, the semiconductor chip 130 may be physically fixed without a separate adhesive.

According to the pressurized semiconductor package and the method of manufacturing the same, the semiconductor chip is physically pressurized by at least one pressurizing member and is electrically connected to improve durability of the semiconductor package and to simplify a manufacturing process. Also, since a separate adhesive is not used, the semiconductor may be operated in a high-temperature environment regardless of a melting point of an adhesive and thereby, durability may be improved. In addition, when assembly errors or mistakes are identified from a property test performed after assembling the semiconductor package or when the semiconductor chip is damaged, re-assembling may be easily performed after errors or mistakes are corrected or the semiconductor chip is replaced.

According to the present invention, the semiconductor chip is physically pressurized by at least one pressurizing member and is electrically connected to improve durability of the semiconductor package and to simplify a manufacturing process. Also, since a separate adhesive is not used, the semiconductor may be operated in a high-temperature environment regardless of a melting point of an adhesive and thereby, durability may be improved. In addition, when assembly errors or mistakes are identified from a property test performed after assembling the semiconductor package or when the semiconductor chip is damaged, re-assembling may be easily performed after errors or mistakes are corrected or the semiconductor chip is replaced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pressurized semiconductor package comprising:
    a lead frame comprising at least one pad board and at least one first terminal formed on the pad board;
    at least one semiconductor chip placed on the lead frame;
    at least one pressurizing member stacked on the semiconductor chip to pressurize the semiconductor chip so as to electrically connect the first terminals to the semiconductor chips; and
    a package housing formed on the pad boards to protect the semiconductor chips,
    wherein the first terminals are bent in a vertical direction from a pad area, and the pressurizing members comprise a first pressurizing member comprising a pressurizing unit which elastically pressurizes an upper part of the semiconductor chip, and a second terminal which is connected to the pressurizing unit, fixed on the pad board, and bent in a vertical direction.

2. The pressurized semiconductor package of claim 1, wherein the lead frame comprises a conductive adhesive or a non-conductive adhesive to attach the pad boards to the first terminals.

3. The pressurized semiconductor package of claim 1, wherein the first terminals are attached to the pad boards by using connection members.

4. The pressurized semiconductor package of claim 1, wherein in the lead frame, the first terminals are attached to the pad boards by ultrasonic welding or laser welding.

5. The pressurized semiconductor package of claim 1, wherein the pressurizing members apply pressure to the semiconductor chips so as to electrically connect the first terminals to the semiconductor chips without using a separate adhesive and to allow the semiconductor chips to normally operate, and the pressurizing members remove pressure applied to the semiconductor chips so as to release electrical connection between the first terminals and the semiconductor chips and to allow the semiconductor chips not to normally operate.

6. The pressurized semiconductor package of claim 1, wherein the pressurizing members further comprise at least one additional pressurizing member additionally pressurizing the first pressurizing member to electrically connect the semiconductor chips.

7. The pressurized semiconductor package of claim 1, wherein the semiconductor chips are placed on one end of the first terminals or the pad boards of the lead frame.

8. The pressurized semiconductor package of claim 7, wherein the semiconductor chips are attached to the lead frame by using a conductive adhesive or a non-conductive adhesive or by pressure applied from the pressurizing members without using a separate adhesive.

9. The pressurized semiconductor package of claim 1, wherein the pressurizing members further comprise a second pressurizing member stacked on the upper part of the pressurizing unit of the first pressurizing member, fixed on the pad board, and additionally pressurizing in a direction crossing the pressurizing unit.

10. The pressurized semiconductor package of claim 9, wherein the pressurizing members further comprise a third pressurizing member which penetrates the second pressurizing member and additionally pressurizes the pressurizing unit of the first pressurizing member toward the semiconductor chip.

11. The pressurized semiconductor package of claim 1, wherein the first terminals are bent in a vertical direction from the pad board and are bent in an inner direction or an outer direction of the package housing to finally form the pressurized semiconductor package.

12. A method of manufacturing a pressurized semiconductor package, the method comprising:
preparing a lead frame comprising at least one pad board and at least one first terminal formed on the pad board;
placing at least one semiconductor chip on the lead frame;
stacking at least one pressurizing member on the semiconductor chip to pressurize the semiconductor chip so as to electrically connect the first terminals to the semiconductor chips; and
forming a package housing formed on the pad boards to protect the semiconductor chips,
wherein the first terminals are bent in a vertical direction from a pad area, and the pressurizing members comprise a first pressurizing member comprising a pressurizing unit which elastically pressurizes an upper part of the semiconductor chip, and a second terminal which is connected to the pressurizing unit, fixed on the pad board, and bent in a vertical direction.

13. The method of claim 12, wherein the pressurizing members apply pressure to the semiconductor chips so as to electrically connect the first terminals to the semiconductor chips without using a separate adhesive and to allow the semiconductor chips to normally operate, and the pressurizing members remove pressure applied to the semiconductor chips so as to release electrical connection between the first terminals and the semiconductor chips and to allow the semiconductor chips not to normally operate.

14. The method of claim 12, wherein the pressurizing members further comprise at least one additional pressurizing member additionally pressurizing the first pressurizing member to electrically connect the semiconductor chips.

15. The method of claim 12, wherein the semiconductor chips are attached to the lead frame by using pressure applied from the pressurizing members without using a separate adhesive.

16. The method of claim 12, wherein the pressurizing members further comprise a second pressurizing member stacked on the upper part of the pressurizing unit of the first pressurizing member, fixed on the pad board, and additionally pressurizing in a direction crossing the pressurizing unit.

17. The method of claim 16, wherein the pressurizing members further comprise a third pressurizing member which penetrates the second pressurizing member and additionally pressurizes the pressurizing unit of the first pressurizing member toward the semiconductor chip.

18. The method of claim 12, wherein the first terminals are bent in a vertical direction from the pad board and are bent in an inner direction or an outer direction of the package housing to finally form the pressurized semiconductor package.

* * * * *